United States Patent
Ikejiri et al.

(10) Patent No.: US 10,934,640 B2
(45) Date of Patent: Mar. 2, 2021

(54) GLASS CLOTH, PREPREG, AND GLASS FIBER REINFORCED RESIN MOLDED PRODUCT

(71) Applicant: NITTO BOSEKI CO., LTD., Fukushima (JP)

(72) Inventors: Hirotaka Ikejiri, Fukushima (JP); Masahiro Awano, Fukushima (JP); Teiji Endo, Fukushima (JP); Hiromitsu Miyagi, Fukushima (JP)

(73) Assignee: Nitto Boseki Co., Ltd., Fukushima (JP)

( * ) Notice: Subject to any disclaimer, the term of this patent is extended or adjusted under 35 U.S.C. 154(b) by 0 days.

(21) Appl. No.: 16/493,630

(22) PCT Filed: Jul. 31, 2018

(86) PCT No.: PCT/JP2018/028596
§ 371 (c)(1),
(2) Date: Sep. 12, 2019

(87) PCT Pub. No.: WO2019/163159
PCT Pub. Date: Aug. 29, 2019

(65) Prior Publication Data
US 2020/0071858 A1    Mar. 5, 2020

(30) Foreign Application Priority Data
Feb. 22, 2018   (JP) .............................. JP2018-029673

(51) Int. Cl.
*D03D 15/267* (2021.01)
*D03D 1/00* (2006.01)
*H05K 1/03* (2006.01)

(52) U.S. Cl.
CPC ......... *D03D 15/267* (2021.01); *D03D 1/0082* (2013.01); *H05K 1/0366* (2013.01); *H05K 2201/0296* (2013.01)

(58) Field of Classification Search
CPC .. D03D 1/0082; D03D 15/12; D03D 15/0011; H05K 2201/0296; H05K 1/0366
See application file for complete search history.

(56) References Cited

FOREIGN PATENT DOCUMENTS

| JP | 2002-348754 A | 12/2002 |
|---|---|---|
| JP | 6020764 B1 | 11/2016 |
| WO | 2017/038240 A1 | 3/2017 |
| WO | 2017/168921 A1 | 10/2017 |

OTHER PUBLICATIONS

Machine Translation of WO2017038240 (Year: 2017).*

* cited by examiner

*Primary Examiner* — Peter Y Choi
*Assistant Examiner* — Jenna N Chandhok
(74) *Attorney, Agent, or Firm* — Carrier Blackman & Associates, P.C.; Joseph P. Carrier; Anne G. Sabourin

(57) ABSTRACT

Provided is a glass cloth enabling to reduce a mass of the glass cloth, being manufactured efficiently, suppressing generation of pinholes in a prepreg including the glass cloth, and maintaining excellent appearance. The glass cloth is composed of warps and wefts obtained by bundling 30 to 44 glass filaments having a diameter in the range of 3.0 to 4.0 μm, the weave densities of the warp and the weft being in the range of 100 to 125 yarns/25 mm; the glass cloth has a thickness in the range of 6.5 to 11.0 μm; the glass yarn coverage C is 85.5 to 99.5%; and the glass yarn coverage C, the average value F of the number of glass filaments constituting the warp and the weft, and the average value D of the weave densities of the warp and the weft satisfy the following expression (1):

$$53.0 \leq C \times F^{1/2}/D^{1/2} \leq 57.3 \qquad (1).$$

4 Claims, No Drawings

GLASS CLOTH, PREPREG, AND GLASS FIBER REINFORCED RESIN MOLDED PRODUCT

TECHNICAL FIELD

The present invention relates to a glass cloth, a prepreg, and a glass fiber reinforced resin molded product.

BACKGROUND ART

Conventionally, as an insulating material in a printed wiring board, a prepreg in which a glass cloth is impregnated with a resin such as an epoxy resin is used. The glass cloth is composed of warps and wefts in which a plurality of glass filaments are bundled.

In recent years, in order to miniaturize, thin, and highly functionalize electronic devices, thinning of the printed wiring board and the prepreg is also required. For this reason, a glass cloth with a reduced thickness has been proposed (refer to Patent Literature 1, for example).

CITATION LIST

Patent Literature

Patent Literature 1: Japanese Patent No. 6020764

SUMMARY OF INVENTION

Technical Problem

Nowadays, in order to further miniaturize, thin, and highly functionalize electronic devices, thinning of the printed wiring board and the prepreg is more required and their weight reduction is also more required. In response to these requirements, attempts have been made to reduce the amount of a resin used for the printed wiring board and the prepreg. When the amount of the resin is reduced, pinholes are more easily generated when the resin is impregnated into the glass cloth to form a prepreg. In order to suppress the easy generation of the pinholes, the amount of glass yarn in the glass cloth, that is, the weave density of warp and weft is required to be increased.

However, an increase in the weave density causes the disadvantage that the weight reduction of the printed wiring board and the prepreg is difficult.

For example, in the glass cloth described in Patent Literature 1, when the weave density of each of the warp and weft is 100 yarns/25 mm or more, the mass of the glass cloth becomes 9.1 g/m² or more, and the weight reduction of the glass cloth becomes insufficient. Therefore, the printed wiring board and the prepreg cannot be reduced in weight sufficiently.

In order to thin the printed wiring board and the prepreg while increasing the amount of glass yarn, stronger spreading needs to be performed for the glass cloth. The spreading is a treatment of reducing the thickness of the glass cloth by widening the width of glass yarn, thereby reducing the thickness of the glass yarn.

However, when a stronger spreading is applied to the glass cloth, there is a disadvantage that distortion occurs in the glass cloth and thereby the appearance of the prepreg is deteriorated.

When the amount of glass yarn is increased in weaving with glass yarns, the breakage of glass yarn, particularly the warp, occurs, which may lead to the disadvantage that the glass cloth cannot be manufactured efficiently.

The present invention overcomes such disadvantages and an object thereof is to provide a glass cloth, in which weight reduction of the glass cloth can be realized with the mass of the glass cloth being less than 9.1 g/m² even when the amount of glass yarn is increased to set the weave density of each of the warp and weft to 100 yarns/25 mm or more, which can be efficiently manufactured, with which generation of pinholes can be suppressed in the prepreg including the glass cloth, and which can maintain excellent appearance.

Moreover, an object of the present invention is to provide a prepreg and a glass fiber reinforced resin molded product, both including the glass cloth.

Solution to Problem

In order to achieve such objects, a glass cloth of the present invention is composed of a warp and a weft each obtained by bundling 30 to 44 glass filaments having a diameter in a range of 3.0 to 4.0 µm, wherein the weave density of each of the warp and weft is in a range of 100 to 125 yarns/25 mm; the glass cloth has a thickness in a range of 6.5 to 11.0 µm; a glass yarn coverage C (100×(25000 (µm)×warp width (µm)×warp weave density (yarns/25 mm)+25000 (µm)×weft yarn width (µm)×weft weave density (yarns/25 mm)-warp yarn width (µm)×warp weave density (yarns/25 mm)×weft yarn width (µm)×weft weave density (yarns/25 mm))/(25000 (µm)×25000 (µm))) is in a range of 85.5 to 99.5%; and the glass yarn coverage C, an average value F of the number of glass filaments constituting the warp and a number of glass filaments constituting the weft, and an average value D of the weave density of the warp and the weave density of the weft satisfy following expression (1).

$$53.0 \le C \times F^{1/2}/D^{1/2} \le 57.3 \quad (1)$$

In the glass cloth of the present invention, in order to reduce the mass of the glass cloth by setting less than 9.1 g/m² of the mass of the glass cloth, suppress generation of pinholes in the prepreg including the glass cloth, and maintain excellent appearance, the glass yarn coverage C, the average value F of the number of the glass filaments constituting the warp and the number of the glass filaments constituting the weft, and the average value D of the weave density of the warp and the weave density of the weft are required to satisfy the above expression (1). In the case of the value of $C \times F^{1/2}/D^{1/2}$ being less than 53.0, it is difficult to suppress generation of pinholes in the prepreg including the glass cloth, to maintain appearance of the prepreg, or to efficiently manufacture the glass cloth. In the case of the value of $C \times F^{1/2}/D^{1/2}$ being more than 57.3, the glass cloth cannot be sufficiently reduced in weight.

In the glass cloth of the present invention, each of the warp and the weft is required to be obtained by bundling 30 to 44 glass filaments having a diameter of 3.0 to 4.0 µm. The diameter of the glass filament constituting the warp or the weft is more than 4.0 µm or the number of the glass filaments is more than 44, allowing not to sufficiently reduce the mass of the glass cloth. The diameter of the glass filament constituting the warp or the weft is less than 3.0 µm, leading to a concern about the influence on the human body. When the number of the glass filament is less than 30, it is difficult to suppress generation of pinholes in the prepreg including the glass cloth.

In the glass cloth of the present invention, when the warp and the weft are used, the weave density of each of the warp and the weft is required to be in the range of 100 to 125 yarns/25 mm. When the weave densities of the warp and the weft exceed 125 yarns/25 mm, the mass of the glass cloth cannot be reduced sufficiently and it is difficult to efficiently manufacture the glass cloth. On the other hand, when the weave densities of the warp and the weft are less than 100 yarns/25 mm, it is difficult to suppress generation of pinholes in the prepreg including the glass cloth.

The glass cloth of the present invention is also required to have a thickness in the range of 6.5 to 11.0 μm. In the glass cloth of the present invention, when the spreading applied to the glass cloth is insufficient, the thickness becomes more than 11.0 μm. In this case, it becomes difficult to suppress generation of pinholes in the prepreg including the glass cloth. In the glass cloth of the present invention, it is technically difficult to set the thickness less than 6.5 μm.

The glass cloth of the present invention requires to have a glass yarn coverage C in the range of 85.5 to 99.5%, wherein the glass yarn coverage C=(100×(25000 (μm)×warp yarn width (μm)×warp weave density (yarns/25 mm)+25000 (μm)×weft yarn width (μm)×weft weave density (yarns/25 mm)-warp yarn width (μm)×warp weave density (yarns/25 mm)×weft yarn width (μm)×weft weave density (yarns/25 mm))/(25000 (μm)×25000 (μm))).

In the glass cloth of the present invention, when the glass yarn coverage C is less than 85.5%, it is difficult to suppress generation of pinholes in the prepreg including the glass cloth. In the glass cloth of the present invention, it is technically difficult to set the glass yarn coverage C to more than 99.5%.

In the glass cloth of the present invention having the above-described configuration, the glass yarn coverage C; the average value F of the number of the glass filaments constituting the warp and the number of the glass filaments constituting the weft; and the average value D of the weave density of the warp and the weave density of the weft preferably satisfy the following expression (2).

$$53.6 \leq C \times F^{1/2}/D^{1/2} \leq 55.9 \quad (2)$$

The glass cloth of the present invention satisfies the formula (2), and is capable of highly reducing the mass of the glass cloth as a mass of the glass cloth of less than 8.7 g/m². The glass cloth of the present invention satisfies the expression (2), and enables suppressing generation of pinholes in the prepreg including the glass cloth.

The prepreg of the present invention includes the glass cloth of the present invention having the above-described configuration. The prepreg of the present invention includes the glass cloth of the present invention having the above-described configuration, thereby being capable of suppressing generation of pinholes, maintaining excellent appearance, highly thinning, and highly reducing weight.

The glass fiber reinforced resin molded product of the present invention includes the glass cloth of the present invention having the above-described configuration. The glass fiber reinforced resin molded product of the present invention includes the glass cloth of the present invention having the above-described configuration, thereby being capable of highly thinning and highly reducing weight.

DESCRIPTION OF EMBODIMENTS

Hereinafter, embodiments of the present invention will be described in detail.

The glass cloth of the present embodiments is composed of the warp and the weft. Each of the warp and the weft is obtained by bundling 30 to 44 glass filaments. The glass filament has a diameter in the range of 3.0 to 4.0 μm (hereinafter sometimes described as filament diameter). The weave density of each of the warp and the weft is in the range of 100 to 125 yarns/25 mm.

In the glass cloth of the present embodiments, each of the warp and the weft is preferably obtained by bundling 33 to 43 glass filaments having a filament diameter of 3.0 to 3.9 μm, more preferably bundling 35 to 42 glass filaments having a filament diameter of 3.1 to 3.8 μm, and still more preferably bundling 36 to 39 glass filaments having a filament diameter of 3.2 to 3.7 μm.

In the glass cloth of the present embodiments, the warp and the weft are preferably those obtained by bundling substantially the same number of glass filaments having substantially the same filament diameter. The expression "those obtained by bundling substantially the same number of glass filaments having substantially the same filament diameter" means to have the same nomenclature code (US System Nomenclature or SI Nomenclature) based on the IPC-4412 standard. For example, in treating the warp and the weft as B5000 based on the IPC-4412 standard, even when the measured values of the filament diameter or the number of filaments of the warp and the weft do not coincide completely, this case is regarded as "those obtained by bundling substantially the same number of glass filaments having substantially the same filament diameter".

In the glass cloth of the present embodiments, each of the weave densities of the warp and the weft is preferably 100 to 125 yarns/25 mm, more preferably 102 to 115 yarns/25 mm, and still more preferably 103 to 112 yarns/25 mm.

In the glass cloth of the present embodiments, the ratio of the weave density of the weft to the weave density of the warp (the weave density of the weft/the weave density of the warp) is preferably 0.85 to 1.15, more preferably 0.90 to 1.10, still more preferably 0.95 to 1.05, and most preferably 1.00 to 1.05, from the viewpoint of reducing the anisotropy against the thermal processing or the like in the printed wiring board using the prepreg including the glass cloth of the present embodiments.

The glass cloth of the present embodiments has a thickness in the range of 6.5 to 11.0 μm, preferably a thickness in the range of 8.0 to 10.6 μm, more preferably a thickness in the range of 8.5 to 10.4 μm, particularly preferably a thickness in the range of 9.0 to 10.2 μm, and most preferably a thickness in the range of 9.5 to 10.1 μm.

In the glass cloth of the present embodiments, the yarn width of the warp is, for example, in the range of 110 to 150 μm, preferably in the range of 115 to 150 μm, more preferably in the range of 117 to 145 μm, still more preferably in the range of 118 to 140 μm, particularly preferably in the range of 119 to 139 μm, and most preferably in the range of 120 to 138 μm. The yarn width of the weft is, for example, in the range of 155 to 210 μm, preferably in the range of 160 to 200 μm, more preferably in the range of 165 to 195 μm, still more preferably in the range of 170 to 190 μm, particularly preferably in the range of 171 to 189 μm, and most preferably in the range of 172 to 188 μm.

The yarn width of the warp can be controlled by the diameter and the number of the glass filaments constituting the warp, the weave density of the warp, and the intensity of the above-described spreading. The yarn width of the weft can be controlled by the diameter and the number of the glass filaments constituting the weft, the weave density of the weft, and the intensity of the above-described spreading.

The glass cloth of the present embodiments has a glass yarn coverage C in the range of 85.5 to 99.5%, preferably has a glass yarn coverage C in the range of 87.0 to 98.0%, more preferably has a glass yarn coverage C in the range of 88.0 to 95.0%, still more preferably has a glass yarn coverage C in the range of 89.0 to 94.0%, especially preferably has a glass yarn coverage C in the range of 89.5 to 93.8%, particularly preferably has a glass yarn coverage C in the range of 90.0 to 93.5%, more especially preferably has a glass yarn coverage C in the range of 90.5 to 93.0%, and most preferably has a glass yarn coverage C in the range of 91.0 to 92.5%.

The glass yarn coverage C can be calculated by the following expression, based on the yarn width and the weave density of each of the warp and the weft.

The glass yarn coverage C=100×(25000 (μm)×warp yarn width (μm)×warp weave density (1/25 mm)+25000 (μm)×weft yarn width (μm)×weft weave density (yarns/25 mm)−warp yarn width (μm)×warp weave density (yarns/25 mm)×weft yarn width (μm)×weft weave density (yarns/25 mm))/(25000 (μm)×25000 (μm)).

Thus, in the same manner as the yarn width of the warp and the weft, the glass yarn coverage C can be controlled by the diameter and the number of the glass filaments constituting the warp or the weft, the weave density of the warp or the weft, and the intensity of the above-described spreading, and is a characteristic that comprehensively reflects these various factors. Particularly, the glass yarn coverage C can effectively express the intensity of the spreading.

In the glass cloth of the present embodiments, the glass yarn coverage C; average value F of the number of the glass filaments constituting the warp and the number of the glass filaments constituting the weft; and average value D of the weave density of the warp and the weave density of the weft satisfy the following expression (3).

$$53.0 \leq C \times F^{1/2}/D^{1/2} \leq 57.3 \quad (3)$$

In the glass cloth of the present embodiments, the C, F, and D preferably satisfy the following expression (4), more preferably satisfy the following expression (5), still more preferably satisfy the following expression (6), particularly preferably satisfy the following expression (7), more particularly preferably satisfy the following expression (8), more particularly preferably satisfy the following expression (9), and most preferably satisfy the following expression (10).

$$53.3 \leq C \times F^{1/2}/D^{1/2} \leq 56.5 \quad (4)$$

$$53.6 C \times F^{1/2}/D^{1/2} \leq 55.9 \quad (5)$$

$$53.9 \leq C \times F^{1/2}/D^{1/2} \leq 55.7 \quad (6)$$

$$54.0 \leq C \times F^{1/2}/D^{1/2} \leq 55.5 \quad (7)$$

$$54.2 \leq C \times F^{1/2}/D^{1/2} \leq 55.2 \quad (8)$$

$$54.4 \leq C \times F^{1/2}/D^{1/2} \leq 55.1 \quad (9)$$

$$54.5 \leq C \times F^{1/2}/D^{1/2} \leq 55.0 \quad (10)$$

In the glass cloth of the present embodiments, the value of (yarn width of the warp)/(diameter of the glass filament constituting the warp×number of the glass filaments constituting the warp) is, for example, in the range of 0.80 to 1.10 and preferably in the range of 0.85 to 1.05. In the glass cloth of the present embodiments, the value of (yarn width of the weft)/(diameter of the glass filament constituting the weft× number of the glass filaments constituting the weft) is in the range of 1.21 to 1.50 and preferably in the range of 1.25 to 1.40.

The glass cloth of the present embodiments has the above-described configuration and thereby has a mass of less than 9.1 g/m$^2$ and preferably has a mass of less than 8.7 g/m$^2$. The lower limit of the mass of the glass cloth of the present embodiments is, for example, 5.0 g/m$^2$.

The thickness of the glass cloth is an average value of measurement values when the thickness is measured with a micrometer at 15 points in the glass cloth in accordance with JIS R 3420.

The mass of the glass cloth is an average value of values obtained by measuring the mass of the glass cloth cut into a size of 200 mm×200 mm at three points with a scale in accordance with JIS R 3420 to convert each measured value into a mass per m$^2$.

The filament diameter of the warp or the weft is an average value of the measurement values when the diameter of the glass filament constituting the warp or the weft is measured at 50 points in cross sections of the warp or the weft with a scanning electron microscope (manufactured by Hitachi High-Technologies Corporation, trade name: S-3400N, and magnification: 3000 times). The number of the glass filaments constituting the warp or the weft is an average value of the measurement values when the number of the glass filaments constituting the warp or the weft is measured at 50 points in cross sections of the warp or the weft with the scanning electron microscope (manufactured by Hitachi High-Technologies Corporation, trade name: S-3400N, and magnification: 500 times).

The weave density of the warp can be determined by counting the number of the warps in the range of 25 mm in the weft direction using a textile analyzing glass in accordance with JIS R 3420. The weave density of the weft can be determined by counting the number of the wefts in the range of 25 mm in the warp direction using a textile analyzing glass in accordance with JIS R 3420.

The yarn width of the warp or the weft is an average value of the measurement values when three 60 mm×100 mm samples is cut from the glass cloth and 30 warps or wefts for each sample are measured with a microscope (manufactured by Keyence Corporation, trade name: VHX-2000, and magnification: 200 times).

The glass filament can be obtained by melting and fiberizing a predetermined glass batch (glass raw material), and for example, one having a composition such as an E glass fiber (general-purpose glass fiber) composition, a high strength glass fiber composition, or a low dielectric constant glass fiber composition can be used. The E glass fiber composition includes 52 to 56% by mass of $SiO_2$, 5 to 10% by mass of $B_2O_3$, 12 to 16% by mass of $Al_2O_3$, 20 to 25% by mass of total of CaO and MgO, and 0 to 1% by mass of total of $Na_2O$, $K_2O$, and $Li_2O$. The high strength glass fiber composition includes 57 to 70% by mass of $SiO_2$, 18 to 30% by mass of $Al_2O_3$, 0 to 13% by mass of CaO, 5 to 15% by mass of MgO, 0 to 1% by mass of total of $Na_2O$, $K_2O$, and $Li_2O$, 0 to 1% by mass of $TiO_2$, and 0 to 2% by mass of $B_2O_3$. The low dielectric constant glass fiber composition includes 48 to 62% by mass of $SiO_2$, 17 to 26% by mass of $B_2O_3$, 9 to 18% by mass of $Al_2O_3$, 0.1 to 9% by mass of CaO, 0 to 6% by mass of MgO, 0.05 to 0.5% by mass of total of $Na_2O$, $K_2O$, and $Li_2O$, 0 to 5% by mass of $TiO_2$, 0 to 6% by mass of SrO, 0 to 3% by mass of total of $F_2$ and $Cl_2$, and 0 to 6% by mass of $P_2O_5$.

The glass filament preferably is the E glass fiber composition from the viewpoint of general purpose, and preferably is the high strength glass fiber composition from the viewpoint of suppression of warpage when used as a prepreg. The high strength glass fiber composition includes 64 to 66% by mass of $SiO_2$, 24 to 26% by mass of $Al_2O_3$, and 9 to 11% by mass of MgO, and further preferably includes 99% by mass or more of total of $SiO_2$, $Al_2O_3$, and MgO.

The glass filaments in the number ranging from 30 to 44 are bundled by a known method to form the warp or the weft. Obtaining the warp or the weft by melting a glass batch, forming it into fibers to obtain glass filaments, and then bundling the plurality of glass filaments is referred to as spinning.

The glass cloth of the present embodiments can be obtained by using the warp and the weft, weaving itself by a known loom, and performing the spreading. Examples of the loom include a jet loom such as air jet or water jet, a shuttle loom, and a rapier loom. Examples of the weaving method by the loom include plain weave, satin weave, basket weave, twill weave, and the like.

Examples of the spreading include fiber opening by water flow pressure, fiber opening by high frequency vibration using liquid as medium, fiber opening by pressure of fluid having surface pressure, fiber opening by pressurization with a roll, and the like. Among these spreading processes, using spreading by water flow pressure or fiber opening by high frequency vibration using liquid as medium is preferable in each of the warp and the weft, because variation in yarn width after the spreading is reduced. The spreading can also suppress generation of defects on the appearance of the glass cloth such as bending due to the spreading by combining a plurality of treatment methods.

The prepreg of the present embodiments includes the above-described glass cloth of the present embodiments.

The prepreg of the present embodiments can be obtained by impregnating the resin in the above-described glass cloth and semi-curing it using a known method.

In the prepreg of the present embodiments, the resin to be impregnated in the above-described glass cloth is not particularly limited. Examples of a thermosetting resin as such a resin include epoxy resin, phenol resin, unsaturated polyester resin, melamine resin, modified polyimide resin, and the like. On the other hand, examples of a thermoplastic resin include polyamide resin, polyimide resin, polybutylene terephthalate resin, polyethylene terephthalate resin, polyphenylene sulfide resin, polyphenylene ether resin, modified polyphenylene ether resin, fluorine resin, and the like.

The glass fiber reinforced resin molded product of the present embodiments includes the above-described glass cloth of the present embodiments.

The glass fiber reinforced resin molded product of the present embodiments can be obtained by curing the above-described prepreg of the present embodiments. The glass fiber reinforced resin molded product itself of the present embodiments can be obtained by a known method such as sheet winding molding, infusion molding, and low pressure RIM molding using the above-described glass cloth of the present embodiments, the above-described resin, and other additives.

Examples of applications of the glass fiber reinforced resin molded product of the present embodiments include a printed wiring board, a housing of an electronic device, a separator of a fuel cell, and the like.

Examples and Comparative Examples of the present invention will be shown.

EXAMPLES

Example 1

In the present Example, glass filaments of E glass fiber composition were spun to obtain the warp and the weft. Each of the warp and the weft was obtained by bundling 38 glass filaments having a filament diameter of 3.6 µm, and had a mass of 0.99 tex (g/km).

A plain weave glass cloth was obtained by weaving with an air jet loom and setting the weave density of the warp to 105 yarns/25 mm and the weave density of the weft to 110 yarns/25 mm.

The glass cloth was subjected to heat cleaning, surface treatment, and spreading, and the glass cloth in the present Example was obtained.

The heat cleaning adopted a treatment in which the glass cloth was placed in a heating furnace at an ambient temperature of 350° C. to 400° C. for 60 hours and the bundling agent for spinning and the bundling agent for weaving attached to the glass cloth were thermally decomposed.

The surface treatment adopted a treatment in which a silane coupling agent was applied to the glass cloth and cured while being continuously passed through a 130° C. heating furnace.

The spreading adopted a spreading using water flow pressure in which a tension of 50 N was applied to the warp of the glass cloth and the water flow pressure was set to 1.0 MPa.

The tension applied to the warp of the glass cloth in the step other than the spreading was 70 to 120 N. In the spreading, the value of the tension detected by the tension detector was fed back to the guide roller for transporting the glass cloth, and the tension was adjusted by changing the position of the guide roller.

A prepreg sheet sample for evaluation was obtained by immersing the glass cloth obtained in the present Example in an epoxy resin (manufactured by DIC Corporation, trade name: EPICLON 1121N-80N) diluted with methyl ethyl ketone; impregnating the glass cloth with the resin; passing between slits of 13 µm width to remove excess resin; and holding at a temperature of 150° C. for 1 minute with a drier to semi-cure the glass cloth impregnated with the epoxy resin.

The number of pinholes generated in the prepreg sheet samples for evaluation (the number of pinholes) was evaluated. As for the number of pinholes, an area of 200 mm×600 mm on the surface of the prepreg sheet sample for evaluation was visually confirmed, and the number of pinholes of 0 to 2 was indicated as "⊚" (good), 3 to 5 as "○" (fair), and 6 or more as "×" (poor). The pinhole was observed as a portion where the void portion in the glass cloth was not filled with the resin. The results are shown in Table 1.

The appearance of the prepreg sheet sample for evaluation was evaluated. As for appearance of the prepreg sheet sample for evaluation, the prepreg sheet sample for evaluation was cut into a size of 200 mm×200 mm and placed on a surface plate, and deformation (warpage or waving) of the prepreg was observed by visual confirmation and no deformation was indicated as "○" (fair) and deformation as "×" (poor). The results are shown in Table 1.

The manufacturing efficiency of the glass cloth obtained in the present Example was evaluated. As for the manufacturing efficiency of the glass cloth, when the value of (actual loom operation time)/(actual loom operation time+time when the loom stopped operating due to yarn breakage of the warp) in manufacturing the glass cloth in the present Example for 24 hours was 0.8 or more, this case was indicated as "◯" (fair) meaning being suitable for industrial production, and when the value was less than 0.8, this case was indicated as "×" (poor), meaning to be unsuitable for industrial production. The results are shown in Table 1. Evaluation of the number of pinholes in 10 sheets of the prepreg sheet sample for evaluation showed that the average value of the number of pinholes was 0.3.

The mass of the glass cloth in the present Example was measured by the above-described method. The results are shown in Table 1.

Example 2

In the present Example, a glass cloth was obtained in the same manner as in Example 1 except that a tension of 60 N was applied to the warp of the glass cloth as the spreading and the spreading with a water flow pressure set to a water flow pressure of 1.0 MPa was adopted.

As for the glass cloth obtained in the present Example, the pinhole number and appearance of the prepreg containing the glass cloth, and the manufacturing efficiency of the glass cloth were evaluated in the same manner as in Example 1, and the mass of the glass cloth was measured in the same manner as in Example 1. The results are shown in Table 1. Evaluation of the number of pinholes in 10 sheets of the prepreg sheet sample for evaluation showed that the average value of the number of pinholes was 0.5.

Example 3

In the present Example, a glass cloth was obtained in the same manner as in Example 1 except that a tension of 70 N was applied to the warp of the glass cloth as the spreading and the spreading with a water flow pressure set to a water flow pressure of 0.7 MPa was adopted.

As for the glass cloth obtained in the present Example, the pinhole number and appearance of the prepreg containing the glass cloth, and the manufacturing efficiency of the glass cloth were evaluated in the same manner as in Example 1, and the mass of the glass cloth was measured in the same manner as in Example 1. The results are shown in Table 1.

Example 4

In the present Example, a glass cloth was obtained in the same manner as in Example 1, except that as each of the warp and the weft, a glass yarn obtained by bundling 41 glass filaments having a filament diameter of 3.6 μm and having a mass of 1.07 tex (g/km) was used and the weave density of the weft was 100 yarns/25 mm.

As for the glass cloth obtained in the present Example, the pinhole number and appearance of the prepreg containing the glass cloth, and the manufacturing efficiency of the glass cloth were evaluated in the same manner as in Example 1, and the mass of the glass cloth was measured in the same manner as in Example 1. The results are shown in Table 1.

Example 5

In the present Example, a glass cloth was obtained in the same manner as in Example 1 except that a tension of 65 N was applied to the warp of the glass cloth as the spreading and the spreading with a water flow pressure set to a water flow pressure of 0.9 MPa was adopted.

As for the glass cloth obtained in the present Example, the pinhole number and appearance of the prepreg containing the glass cloth, and the manufacturing efficiency of the glass cloth were evaluated in the same manner as in Example 1, and the mass of the glass cloth was measured in the same manner as in Example 1. The results are shown in Table 1. Observation of the number of pinholes in 10 sheets of the prepreg sheet sample for evaluation showed that the average value of the number of pinholes was 1.0.

Comparative Example 1

In the present Comparative Example, a glass cloth was obtained in the same manner as in Example 3 except that the weave density of the weft was 100 yarns/25 mm.

As for the glass cloth obtained in the present Comparative Example, the pinhole number and appearance of the prepreg containing the glass cloth, and the manufacturing efficiency of the glass cloth were evaluated in the same manner as in Example 1, and the mass of the glass cloth was measured in the same manner as in Example 1. The results are shown in Table 1.

Comparative Example 2

In the present Comparative Example, a glass cloth was obtained in the same manner as in Example 3 except that the weave density of the weft was 123 yarns/25 mm.

As for the glass cloth obtained in the present Comparative Example, the pinhole number and appearance of the prepreg containing the glass cloth, and the manufacturing efficiency of the glass cloth were evaluated in the same manner as in Example 1, and the mass of the glass cloth was measured in the same manner as in Example 1. The results are shown in Table 1.

Comparative Example 3

In the present Comparative Example, a glass cloth was obtained in the same manner as in Example 3, except that as each of the warp and the weft, a glass yarn obtained by bundling 34 glass filaments having a filament diameter of 3.6 μm and having a mass of 0.89 tex (g/km) was used.

As for the glass cloth obtained in the present Comparative Example, the pinhole number and appearance of the prepreg containing the glass cloth, and the manufacturing efficiency of the glass cloth were evaluated in the same manner as in Example 1, and the mass of the glass cloth was measured in the same manner as in Example 1. The results are shown in Table 1.

Comparative Example 4

In the present Comparative Example, a glass cloth was obtained in the same manner as in Example 3, except that as each of the warp and the weft, a glass yarn obtained by bundling 41 glass filaments having a filament diameter of 3.6 μm and having a mass of 1.07 tex (g/km) was used.

As for the glass cloth obtained in the present Comparative Example, the pinhole number and appearance of the prepreg containing the glass cloth, and the manufacturing efficiency of the glass cloth were evaluated in the same manner as in Example 1, and the mass of the glass cloth was measured in the same manner as in Example 1. The results are shown in Table 1.

TABLE 1

| | | Example | | | | | Comparative Example | | | |
|---|---|---|---|---|---|---|---|---|---|---|
| | | 1 | 2 | 3 | 4 | 5 | 1 | 2 | 3 | 4 |
| Warp | Weave density (yarns/25 mm) | 105 | 105 | 105 | 105 | 105 | 105 | 105 | 105 | 105 |
| | Filament diameter (μm) | 3.6 | 3.6 | 3.6 | 3.6 | 3.6 | 3.6 | 3.6 | 3.6 | 3.6 |
| | Number of filaments (–) | 38 | 38 | 38 | 41 | 38 | 38 | 38 | 34 | 41 |
| | Yarn width (μm) | 137 | 125 | 121 | 140 | 123 | 121 | 121 | 110 | 140 |
| Weft | Weave density (yarns/25 mm) | 110 | 110 | 110 | 100 | 110 | 100 | 123 | 110 | 110 |
| | Filament diameter (μm) | 3.6 | 3.6 | 3.6 | 3.6 | 3.6 | 3.6 | 3.6 | 3.6 | 3.6 |
| | Number of filaments (–) | 38 | 38 | 38 | 41 | 38 | 38 | 38 | 34 | 41 |
| | Yarn width (μm) | 185 | 184 | 178 | 190 | 182 | 178 | 168 | 168 | 190 |
| | Thickness (μm) | 10.0 | 10.0 | 10.0 | 10.0 | 10.0 | 10.0 | 10.5 | 10.0 | 10.0 |
| | Glass yarn coverage C (%) | 92.1 | 91.0 | 89.3 | 90.1 | 90.4 | 85.8 | 91.5 | 86.0 | 93.2 |
| | Average value F of the number of filaments of the warp and the number of filaments of the weft (filaments) | 38 | 38 | 38 | 41 | 38 | 38 | 38 | 34 | 41 |
| | Average value D of warp weave density and weft weave density (yarns/25 mm) | 107.5 | 107.5 | 107.5 | 102.5 | 107.5 | 102.5 | 114.0 | 107.5 | 107.5 |
| | $C \times F^{1/2}/D^{1/2}$ | 54.8 | 54.1 | 53.1 | 57.0 | 53.7 | 52.2 | 52.8 | 48.4 | 57.6 |
| | The number of pinholes | ◉ | ◉ | ○ | ○ | ◉ | ○ | ◉ | X | ◉ |
| | Prepreg appearance | ○ | ○ | ○ | ○ | ○ | X | ○ | ○ | ○ |
| | Manufacturing efficiency of glass cloth | ○ | ○ | ○ | ○ | ○ | ○ | X | ○ | ○ |
| | Mass of glass cloth (g/m²) | 8.5 | 8.5 | 8.5 | 8.8 | 8.5 | 8.1 | 9.0 | 8.0 | 9.3 |

The glass cloth in Examples 1 to 5 according to the present invention from Table 1 reveals that the mass of the glass cloth is less than 9.1 g/m² and the mass of the glass cloth can be reduced and manufactured efficiently. The prepreg including the glass cloth in Examples 1 to 5 according to the present invention also reveals that generation of pinholes can be suppressed and an excellent appearance can be maintained.

On the other hand, the glass cloth of Comparative Example 1 has a low $C \times F^{1/2}/D^{1/2}$ value of 52.2, revealing that the appearance of the prepreg cannot be maintained. The glass cloth of Comparative Example 2 has a low $C \times F^{1/2}/D^{1/2}$ value of 52.8, revealing that the glass cloth cannot be manufactured efficiently. The glass cloth of Comparative Example 3 has a low $C \times F^{1/2}/D^{1/2}$ value of 48.4, revealing that generation of pinholes cannot be suppressed. The glass cloth of Comparative Example 4 has a high $C \times F^{1/2}/D^{1/2}$ value of 57.6 and the mass of the glass cloth is 9.1 g/m² or more, revealing that the mass of the glass cloth cannot be reduced.

The invention claimed is:

1. A glass cloth composed of a warp obtained by bundling 30 to 44 glass filaments and a weft obtained by bundling 30 to 39 glass filaments having a diameter in a range of 3.0 to 4.0 μm, wherein a weave density of each of the warp and the weft is in a range of 100 to 125 yarns/25 mm;

the glass cloth has a thickness in a range of 6.5 to 11.0 μm;

a glass yarn coverage C (100×(25000 (μm)×warp yarn width (μm)×warp weave density (yarns/25 mm)+25000 (μm)×weft yarn width (μm)×weft weave density (yarns/25 mm)−warp yarn width (μm)×warp weave density (yarns/25 mm)×weft yarn width (μm)×weft yarn density (yarns/25 mm))/(25000 (μm)×25000 (μm))) is in a range of 85.5 to 99.5%;

the glass yarn coverage C, an average value F of a number of glass filaments constituting the warp and a number of glass filaments constituting the weft, and an average value D of the weave density of the warp and the weave density of the weft satisfy following expression (1); and a value of (the weft yarn width)/(the diameter of the glass filament constituting the weft×the number of the glass filaments constituting the weft) is in a range of 1.25 to 1.40:

$$53.0 \leq C \times F^{1/2}/D^{1/2} \leq 57.3 \quad (1).$$

2. The glass cloth according to claim 1, wherein the glass yarn coverage C; the average value F of the number of the glass filaments constituting the warp and the number of the glass filaments constituting the weft; and the average value D of the weave density of the warp and the weave density of the weft satisfy following expression (2):

$$53.6 \leq C \times F^{1/2}/D^{1/2} \leq 55.9 \quad (2).$$

3. A prepreg comprising the glass cloth according to claim 1.

4. A glass fiber reinforced resin molded product comprising the glass cloth according to claim 1.

* * * * *